(12) United States Patent
Lee

(10) Patent No.: US 7,863,747 B2
(45) Date of Patent: Jan. 4, 2011

(54) SEMICONDUCTOR CHIP, METHOD OF FABRICATING THE SAME AND SEMICONDUCTOR CHIP STACK PACKAGE

(75) Inventor: Min Hyung Lee, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/340,273

(22) Filed: Dec. 19, 2008

(65) Prior Publication Data
US 2009/0160051 A1    Jun. 25, 2009

(30) Foreign Application Priority Data
Dec. 21, 2007    (KR) .................. 10-2007-0134817

(51) Int. Cl.
  *H01L 23/48*    (2006.01)
  *H01L 23/52*    (2006.01)
  *H01L 29/40*    (2006.01)
(52) U.S. Cl. ..................... 257/758; 257/777
(58) Field of Classification Search ........ 257/686, 257/777, 723, 758, 724, 778
See application file for complete search history.

(56) References Cited
U.S. PATENT DOCUMENTS

| | | | | |
|---|---|---|---|---|
| 3,577,037 A | * | 5/1971 | Di Pietro et al. | ............ 257/621 |
| 3,648,131 A | * | 3/1972 | Stuby | .......... 257/622 |
| 4,074,342 A | * | 2/1978 | Honn et al. | .............. 361/779 |
| 6,800,930 B2 | * | 10/2004 | Jackson et al. | .............. 257/700 |
| 7,312,536 B2 | | 12/2007 | Yamano et al. | |
| 2006/0055050 A1 | | 3/2006 | Numata et al. | |
| 2006/0087045 A1 | | 4/2006 | Yamano et al. | |
| 2009/0267232 A1 | * | 10/2009 | Morel et al. | ............. 257/758 |

FOREIGN PATENT DOCUMENTS

| | | |
|---|---|---|
| CN | 1351383 A | 5/2002 |
| CN | 1758430 A | 4/2006 |
| KR | 1020060051422 A | 5/2006 |

OTHER PUBLICATIONS

Numata Hideo Ezawa Hirokazu Ta; "Semiconductor Device and Manufacturing Method Thereof"; espacenet; Chinese Publication No. CN1758430 (A); Publication Date: Apr. 12, 2006; espacenet Database—Worldwide, http://v3.espacenet.com/publicationDetails/biblio?DB=EPODOC&adjacent=true&locale=en....

(Continued)

*Primary Examiner*—S. V Clark
(74) *Attorney, Agent, or Firm*—The Law Offices of Andrew D. Fortney; Andrew D. Fortney

(57) ABSTRACT

Provided are a semiconductor chip, a method of fabricating a semiconductor chip, and a semiconductor chip stack package. The semiconductor chip includes a semiconductor substrate and a semiconductor device on the semiconductor substrate. A dielectric covers the semiconductor device. A top metal is on the dielectric and electrically connected to the semiconductor device. A deep via penetrates the semiconductor substrate and the dielectric. An interconnection connects the deep via and the top metal electrically. A bump is in contact with the top metal and the interconnection.

20 Claims, 8 Drawing Sheets

OTHER PUBLICATIONS

Qibao Wu, Yuzhong Zhang, and Shengguo Wang; "Technology for Preparing Blue LED Chip Based on Gallium Nitride"; espacenet; Chinese Publication No. CN1351383 (A); Publication Date: May 29, 2002; espacenet Database—Worldwide, http://v3.espacenet.com/publicationDetails/biblio?DB=EPODOC&adjacent=true&locale=en....

Partial English Translation of Chinese Office Action dated Jan. 8, 2010; Chinese Patent Application No. 200810186515.X; 2 pgs.; The Stated Intellectual Property Office of P.R.C., People's Republic of China.

Takaharu Yamano, Tadashi Arai and Yoshihiro Machida; "Substrate Using Enhanced Arrangement of External Connection Terminals of Resin Member for Reducing Substarte thickness Regardless of Existence of Embedded Chip and Manufacturing Method Thereof"; Korean Patent Abstracts; Publication No. 1020060051422 A; Publication Date: May 19, 2006; Korean Intellectual Property Office, Republic of Korea.

Korean Office Action dated Mar. 16, 2009; Korean Patent Application No. 10-2007-0134817; Korean Intellectual Property Office, Republic of Korea.

* cited by examiner

SEMICONDUCTOR CHIP, METHOD OF FABRICATING THE SAME AND SEMICONDUCTOR CHIP STACK PACKAGE

CROSS-REFERENCE TO RELATED APPLICATIONS

The present application claims priority under 35 U.S.C. 119 to Korean Patent Application No. 10-2007-0134817 (filed on Dec. 21, 2007), which is hereby incorporated by reference in its entirety.

BACKGROUND

Embodiments of the present invention relate to a semiconductor chip, a method of fabricating a semiconductor chip, and a semiconductor chip stack package.

The recent electronic product market rapidly expands to the field of portable products. Components of portable electronic products should be light, slim, and small. This requires technology that reduces the size of surface mount devices such as semiconductor packages, a system-on-chip technique of integrating a plurality of semiconductor chips into one chip, and a system-in-package technique of integrating a plurality of semiconductor chips into one package.

To integrate a plurality of semiconductor chips into a package, the physical strength of the package should be high, and the performance and reliability of the semiconductor chips inside the package should be high.

SUMMARY

Embodiments of the present invention provide a semiconductor chip for fabricating a semiconductor chip stack package having improved performance.

A semiconductor chip according to embodiments of the present invention may comprise: a semiconductor substrate; a semiconductor device on the semiconductor substrate; a dielectric covering the semiconductor device; a top metal on the dielectric and electrically connected to the semiconductor device; a deep via in the semiconductor substrate and the dielectric; an interconnection electrically connecting the deep via and the top metal; and a bump in contact with the top metal and the interconnection.

According to further embodiments of the present invention, a method of fabricating a semiconductor chip may comprise: forming a semiconductor device on a semiconductor substrate; forming a dielectric to cover the semiconductor device; forming a top metal on the dielectric, the top metal being electrically connected to the semiconductor device; forming a deep via in the semiconductor substrate and the dielectric; forming an interconnection that covers at least portions of the top metal and the deep via; and forming a bump that is in contact with the top metal.

According to still further embodiments of the present invention, a semiconductor chip stack package may comprise: a first semiconductor chip comprising a first semiconductor device on a first semiconductor substrate, a first top metal electrically connected to the first semiconductor device, and a first bump in contact with the first top metal; and a second semiconductor chip on the first semiconductor chip and comprising a deep via in contact with the first bump.

Such semiconductor chips may be stacked, and in this case, a top metal and a deep via of adjacently stacked semiconductor chips may be in contact with each other for electrical connection.

In this case, if the bump, the top metal, and the deep via are formed of the same metal, electric signals can be efficiently transmitted between the semiconductor chips. That is, a semiconductor chip stack package formed of semiconductor chips according to embodiments of the present invention can have improved performance.

In addition, since the bump and the top metal may be in direct contact with each other, a semiconductor chip according to embodiments of the present invention may have a low resistance between the bump and the top metal.

DETAILED DESCRIPTION OF THE EMBODIMENTS

Figure 1:
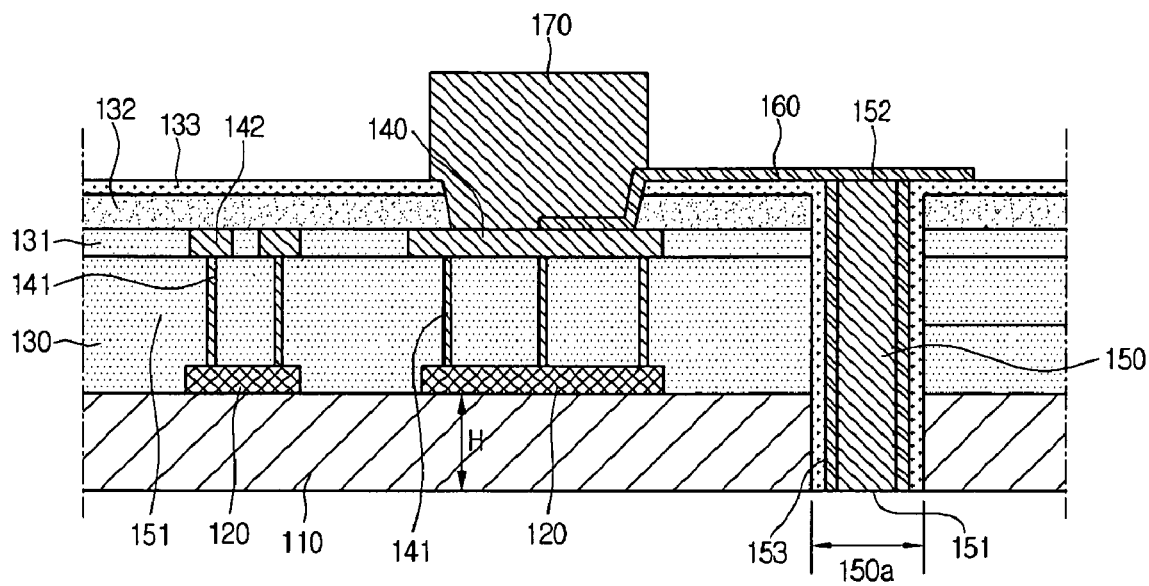
FIG. 1 is a cross-sectional view illustrating an exemplary semiconductor chip according to embodiments of the present invention.

FIG. 1 is a cross-sectional view illustrating an exemplary semiconductor chip according to embodiments of the present invention.

A semiconductor substrate 110 may comprise a silicon wafer having a plate (or substantially circular) shape. The semiconductor substrate 110 may comprise a material such as single crystalline silicon. For example, the semiconductor substrate 110 may have a thickness H in the range from about 40 μm to about 60 μm.

Semiconductor device 120 may be on the semiconductor substrate 110. Examples of the semiconductor device 120 include a double-diffused metal oxide semiconductor (DMOS) transistor, complementary metal oxide semiconductor (CMOS) transistors, a bipolar-junction transistor, a capacitor, and a diode. In certain embodiments, the semiconductor device 120 may include a gate electrode, a source electrode, a drain electrode, and a channel region.

Interlayer dielectric 130 may be formed on the semiconductor substrate 110. The interlayer dielectric 130 may cover the semiconductor device 120. The interlayer dielectric 130 may comprise a material such as borophosphosilicate glass (BPSG) and/or undoped silicate glass (USG).

The top metal 140 may be on the interlayer dielectric 130. The top metal 140 may be electrically connected to the semiconductor device 120 through vias 141 penetrating the interlayer dielectric 130. The top metal 140 and the vias 141 may comprise a material such as copper (Cu), aluminum (Al) or tungsten (W).

An insulating layer 131 may be on sides of the top metal 140 to insulate the top metal 140. In addition, an interconnection pattern 142 having a plurality of lines may be on the interlayer dielectric 130 at a side of the top metal 140.

Furthermore, a passivation layer 132 and a buffer layer 133 may be on the top metal 140, the insulating layer 131, and the interconnection pattern 142 in a manner such that at least a portion of the top metal 140 is exposed.

The deep via 150 may pass through the semiconductor substrate 110, the interlayer dielectric 130, the insulating layer 131, and the passivation layer 132. A lower end surface 151 of the deep via 150 may be exposed, and an upper end surface 152 of the deep via 150 may be connected to the interconnection 160.

The deep via 150 may have a width in the range from about 1 μm to about 100 μm and a length in the range from about 1 μm to about 300 μm. The deep via 150 may comprise a material such as copper (Cu) or tungsten (W).

The deep via 150 may be surrounded by a barrier metal layer 153 and the buffer layer 133. That is, the deep via 150 may be inside a deep via hole 150a, which penetrates the semiconductor substrate 110, the interlayer dielectric 130, the insulating layer 131, and the passivation layer 132.

The buffer layer 133 may be on the inner surface of the deep via hole 150a, and the barrier metal layer 153 may be on the buffer layer 133. The buffer layer 133 may comprise a material such as a silicon oxide, a silicon nitride, or a silicon oxynitride (SiON). The buffer layer 133 may block the semiconductor substrate 110, the interlayer dielectric 130, the insulating layer 131, and the passivation layer 132 that are outside the deep via 150. Specifically, the buffer layer 133 may prevent or reduce formation of silica at the semiconductor substrate 110.

The barrier metal layer 153 may comprise a material such as tantalum (Ta), tantalum nitride (TaN), tantalum silicon nitride (TaSiN), titanium silicon nitride (TiSiN), or rubidium (Rb). The barrier metal layer 153 may isolate the deep via 150 from the semiconductor substrate 110, the interlayer dielectric 130, the insulating layer 131, and the passivation layer 132.

The interconnection 160 may electrically connect the top metal 140 and the deep via 150. The interconnection 160 may cover a portion of the top metal 140 and the upper end surface 152 of the deep via 150. The interconnection 160 may comprise a material such as tantalum (Ta), titanium (Ti), tungsten (W), tantalum nitride, titanium nitride, tungsten nitride, or titanium silicon nitride (TiSiN).

The bump 170 may be on the top metal 140. The bump 170 may be in contact with the top metal 140 and the interconnection 160, and the bump 170 may be electrically connected to the top metal 140 and the interconnection 160. The bump 170 may protrude from the top surface of the semiconductor chip. The bump 170 may be brought into contact with a part such as a deep via of another semiconductor chip or a connection pad of a circuit substrate for electric connection with the part.

The bump 170 may comprise a material such as copper (Cu), aluminum (Al), silver (Ag) or tungsten (W). The top metal 140, the deep via 150, and the bump 170 may comprise the same metal. Therefore, the resistance between the bump 170 and the top metal 140 can be reduced. Furthermore, the top metal 140 and the bump 170 can be bonded to each other more tightly.

In addition, in the case where the bump 170 is connected to a deep via of another semiconductor chip that is formed of the same metal as that used for forming the bump 170, the resistance between the bump 170 and the deep via can be reduced, and the bonding strength between the bump 170 and the deep via can be increased.

Moreover, the bump 170 may be directly connected to the top metal 140. That is, the bump 170 may be in contact with the top metal 140 and the interconnection 160. Therefore, the resistance between the bump 170 and the top metal 140 can be reduced.

Accordingly, a semiconductor chip according to embodiments of the present invention can be used to form a semiconductor chip stack package having improved performance, reduced electric resistance, and increased bonding strength.

FIGS. 2A to 2L are cross-sectional views for illustrating an exemplary method of fabricating a semiconductor chip according to embodiments of the present invention.

Figure 2A:
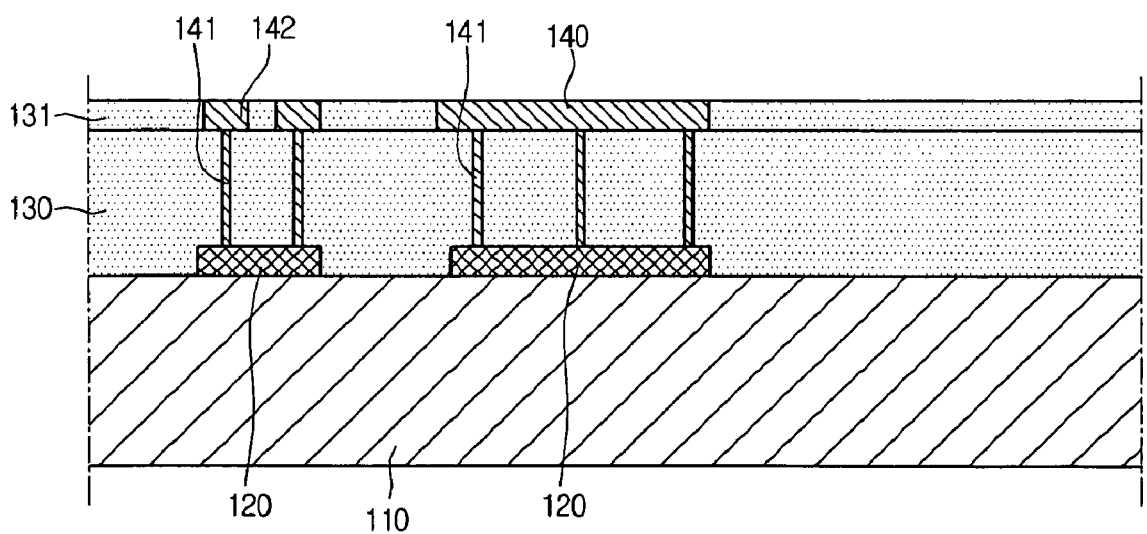
FIGS. 2A to 2L are cross-sectional views for illustrating an exemplary method of fabricating a semiconductor chip according to embodiments of the present invention.

Referring to FIG. 2A, semiconductor devices 120 may be formed on a semiconductor substrate 110, and an interlayer dielectric 130 may be formed to cover the semiconductor devices 120. Vias 141 may be formed through the interlayer dielectric 130 for electric connection with the semiconductor devices 120. Then, an insulating layer 131 may be formed on the interlayer dielectric 130 and may be patterned to form holes for exposing the vias 141.

The insides of the holes may be filled with metal, and the metal and the insulating layer 131 may undergo a chemical mechanical polishing (CMP) process so as to expose the top surface of the top metal 140 and form an interconnection pattern 142.

The vias 141, the top metal 140, and the interconnection pattern 142 may comprise a material such as copper (Cu), aluminum (Al) or tungsten (W).

Figure 2B:
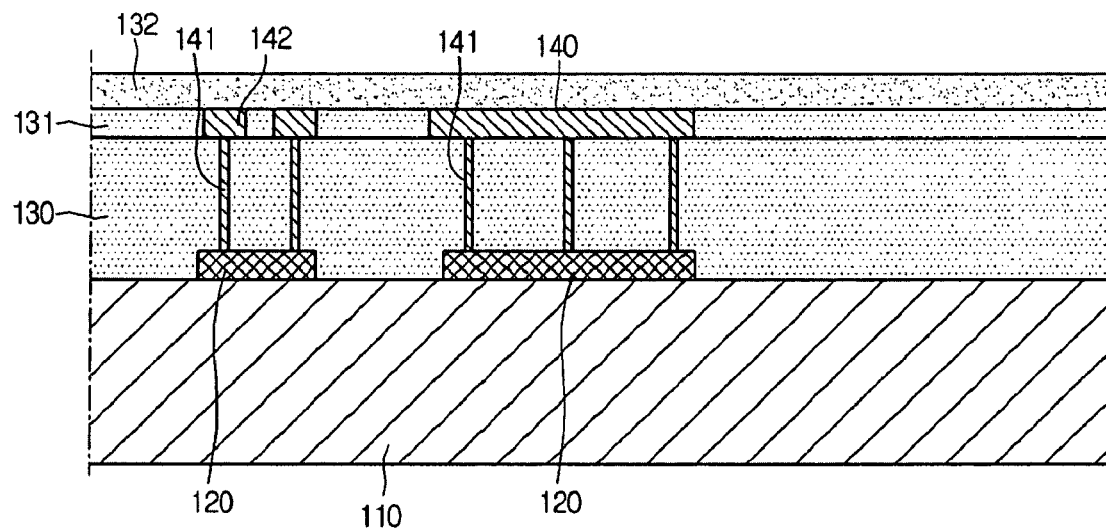

Referring to FIG. 2B, after the CMP process, a passivation layer 132 may be formed to cover the top metal 140 and the insulating layer 131. The passivation layer 132 may comprise a material such as a silicon nitride or a silicon carbide (SiC). The passivation layer 132 may be deposited to a thickness of about 100 Å to about 1000 Å through a plasma-enhanced chemical vapor deposition (PECVD) process.

Figure 2C:
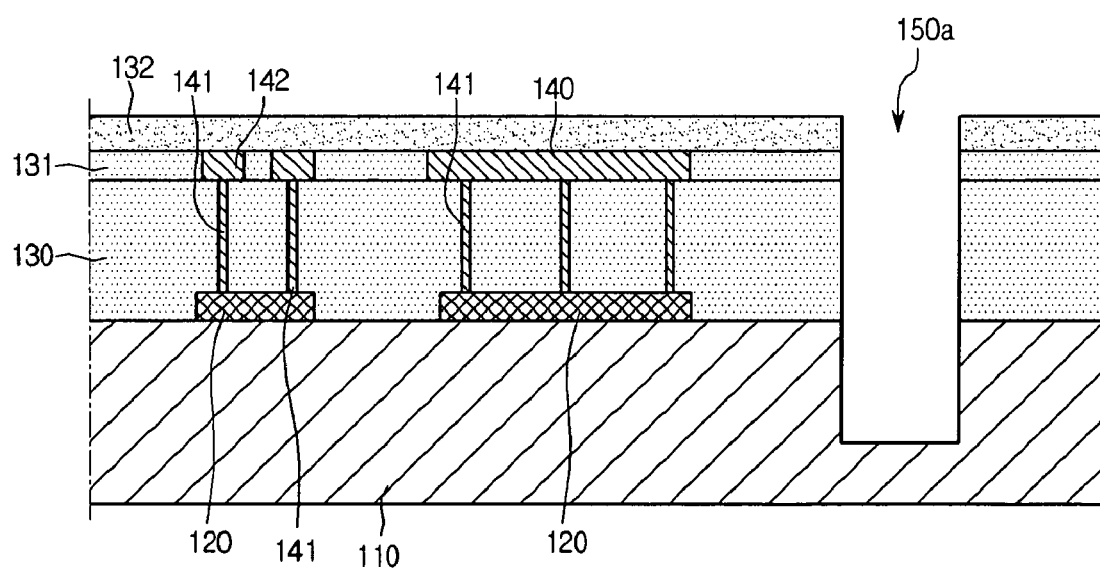

Referring to FIG. 2C, after the passivation layer 132 is formed, a deep via hole 150a may be formed through a portion of the semiconductor substrate 110, the interlayer dielectric 130, the insulating layer 131, and the passivation layer 132. For example, the deep via hole 150a may have a width of about 1 μm to about 100 μm and a depth of about 1 μm to about 300 μm. The deep via hole 150a may be formed through a mask process (e.g., photolithography and etching).

Figure 2D:
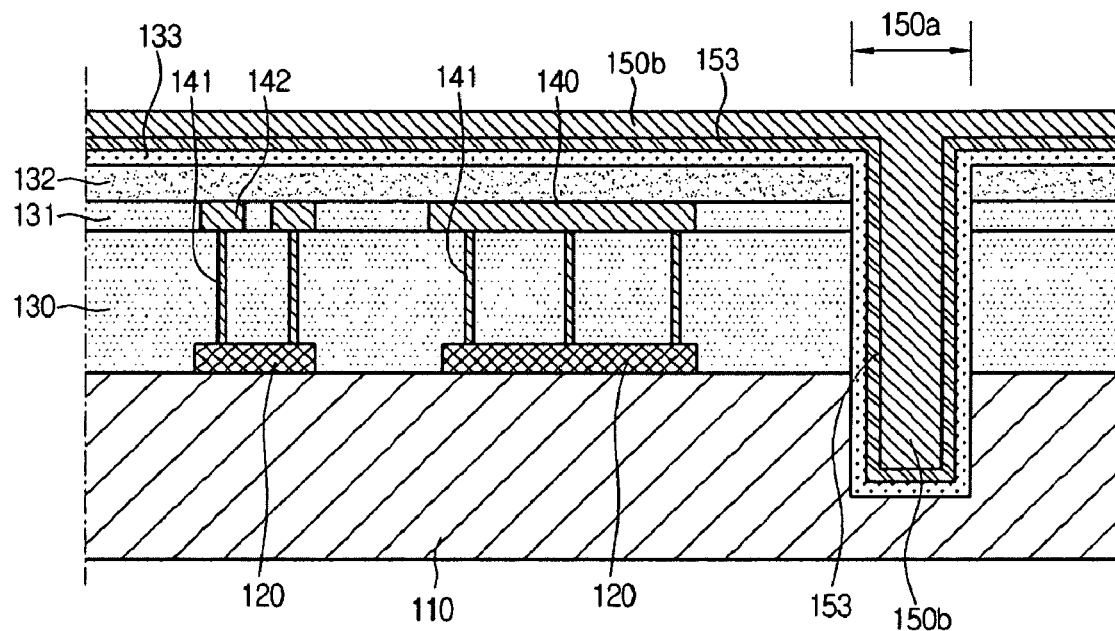

Referring to FIG. 2D, after the deep via hole 150a is formed, a buffer layer 133 may be formed by depositing a material such as a silicon oxide, a silicon nitride, and/or a silicon oxynitride on the passivation layer 132 and inner surfaces of the deep via hole 150a to a thickness of about 1000 Å to about 20000 Å through a PECVD process.

After the buffer layer 133 is formed, at least one of tantalum (Ta), tantalum nitride, tantalum silicon nitride, titanium silicon nitride, or rubidium may be deposited. The material may be deposited to a thickness of about 100 Å to about 2000 Å through a PVD, CVD, or ALD (atomic layer deposition) process so as to form a barrier metal layer 153.

Thereafter, a metal seed layer may be formed on portions of the barrier metal layer 153 inside deep via hole 150a, and a metal 150b such as copper (Cu) or tungsten (W) may be deposited to fill in the deep via hole 150a by an electroplating method so as to form a deep via.

Figure 2E:
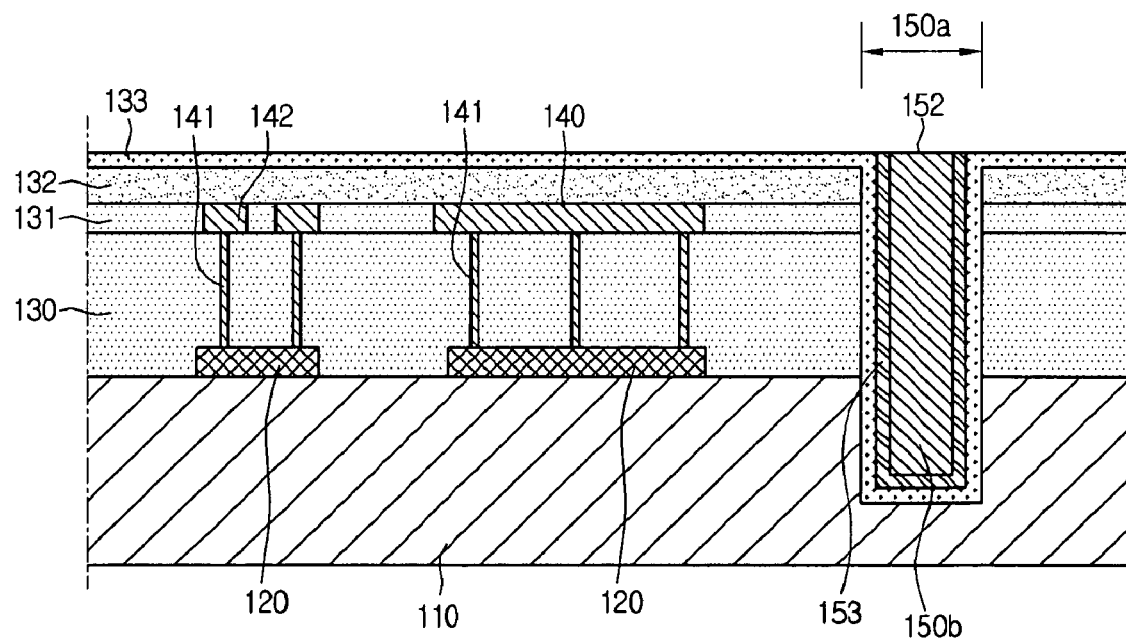

Referring to FIG. 2E, after the metal 150b fills in the deep via hole 150a to form a deep via, a portion of the metal 150b formed on the barrier metal layer 153 and a portion of the barrier metal layer 153 may be removed through a CMP process so as to form a deep via 150.

Figure 2F:
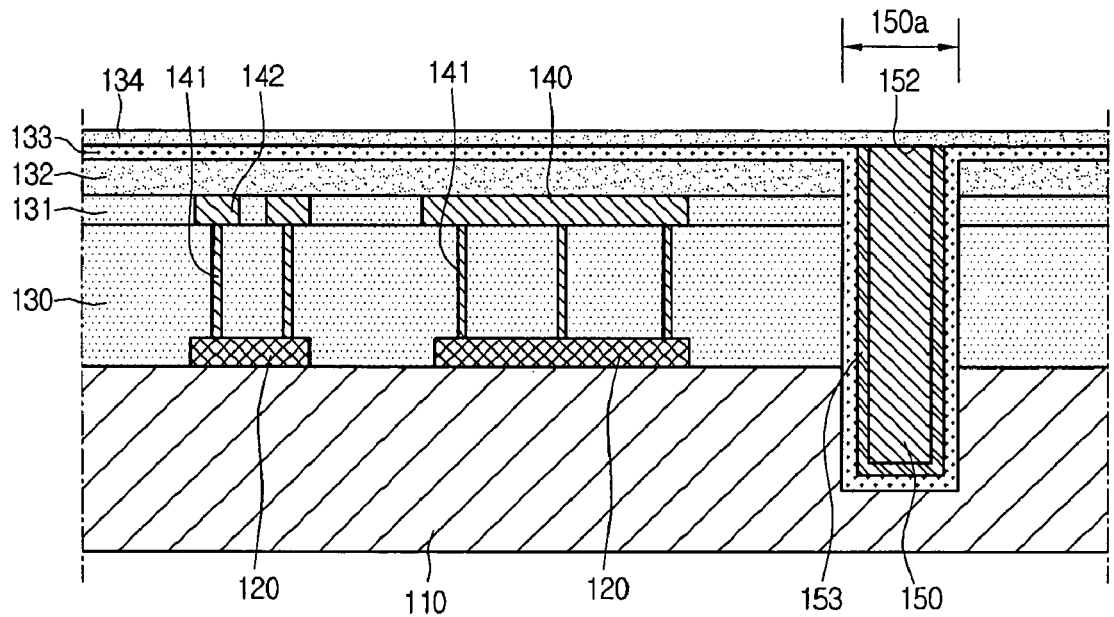

Referring to FIG. 2F, a nitride layer 134 may be formed on the buffer layer 133. The nitride layer 134 may comprise a material such as a silicon nitride. The nitride layer 134 may prevent oxidation of the deep via 150.

Figure 2G:
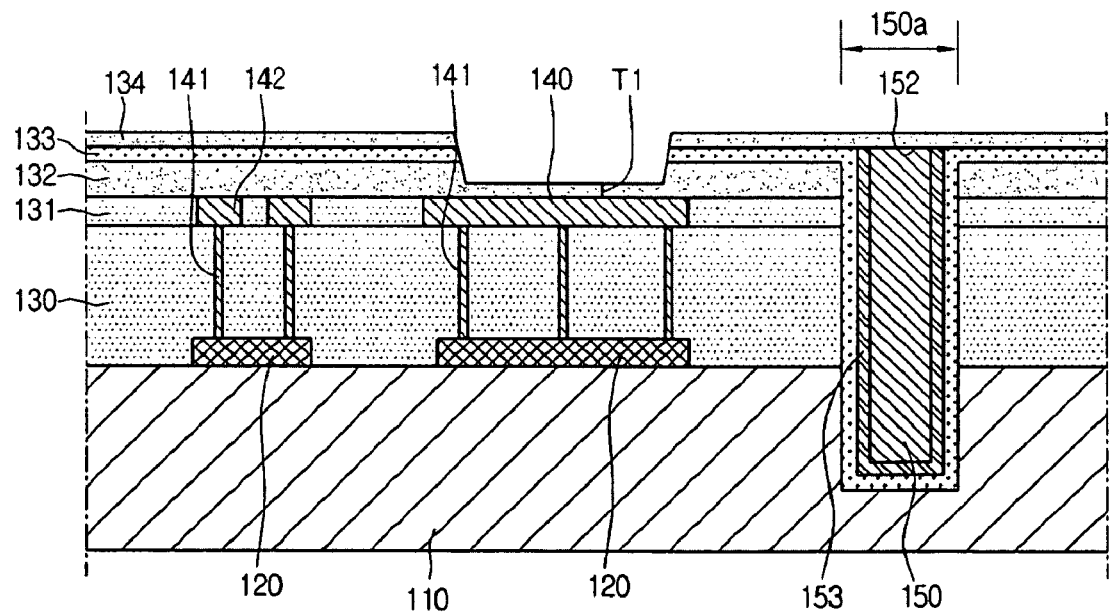

Referring to FIG. 2G, portions of the nitride layer 134, the buffer layer 133, and the passivation layer 132 above the top metal 140 may be removed through a mask process. The portion of the passivation layer 132 above top metal 140 may be partially removed so that a thickness Ti remains on the top metal 140. The thickness Ti may be substantially equal to the thickness of the nitride layer 134. For example, the thickness Ti may range from about 100 Å to about 1000 Å.

Figure 2H:
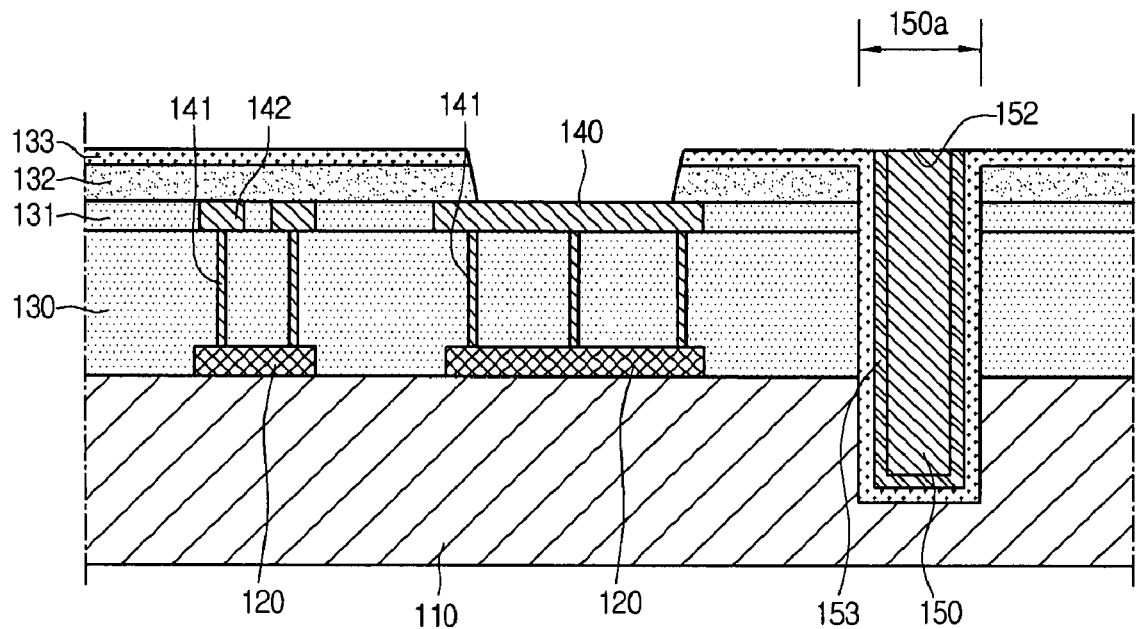

Referring to FIG. 2H, portions of the nitride layer 134 and the passivation layer 132 may be removed through a blanket etching process so as to expose at least a portion of the top metal 140.

Figure 2I:
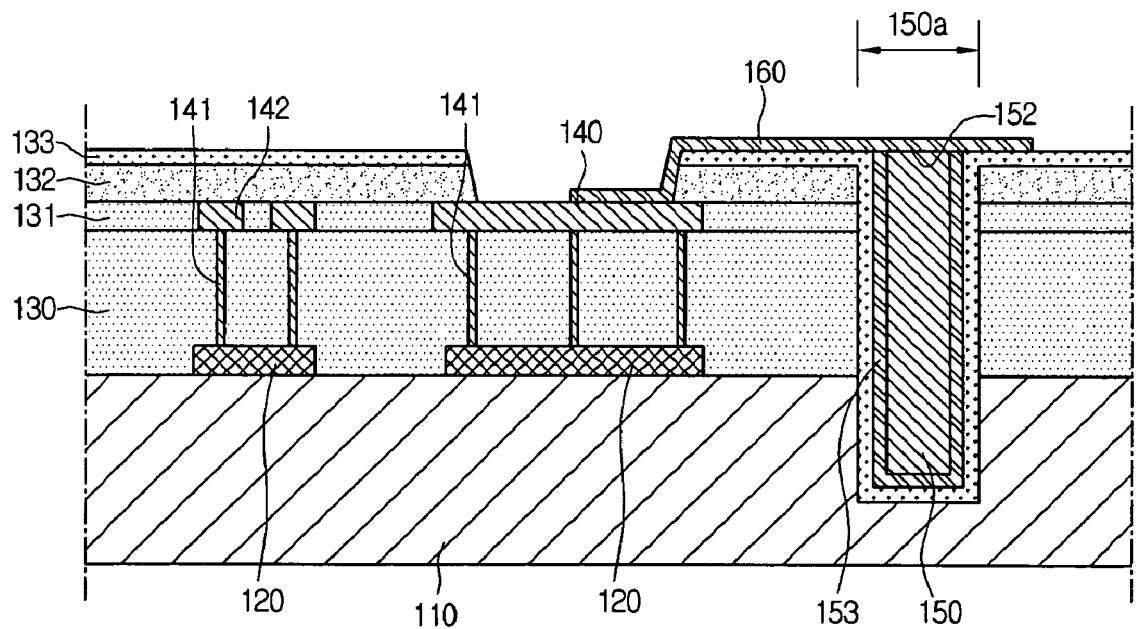

Referring to FIG. 2I, a first metal layer may be formed on the entire surface of the semiconductor chip, and the first metal layer patterned through a mask process so as to form an interconnection 160 that covers the entire top surface of the deep via 150 and a portion of the top metal 140. The first metal layer may comprise a material such as tantalum, titanium, tungsten, tantalum nitride, titanium nitride, tungsten nitride, and/or titanium silicon nitride.

Figure 2J:
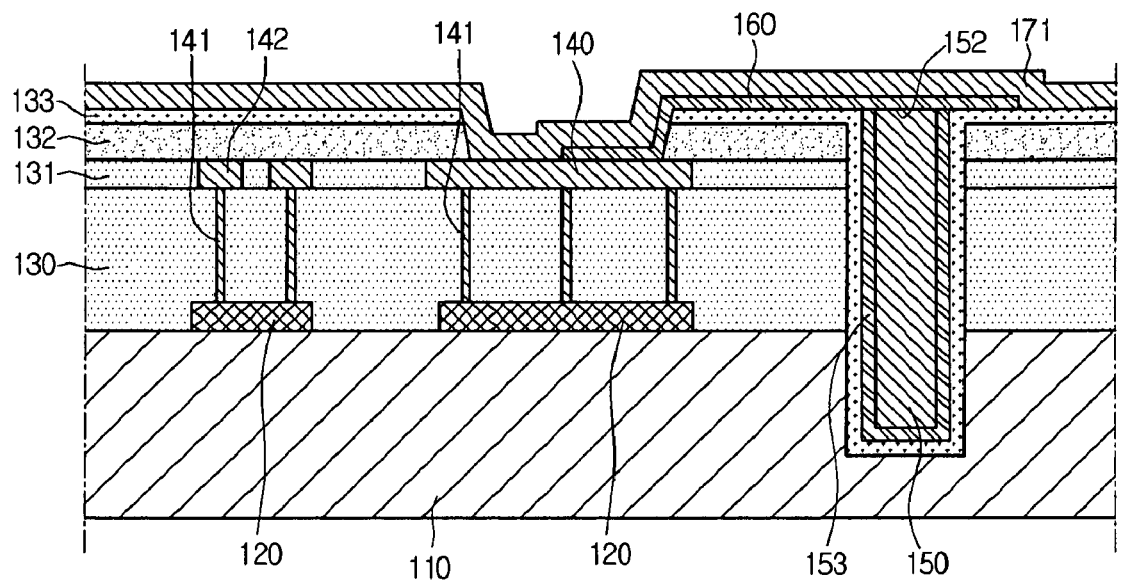

Referring to FIG. 2J, a second metal layer 171 may be formed on the entire surface of the semiconductor chip using the same metal as the metal used for forming the top metal 140.

Figure 2K:
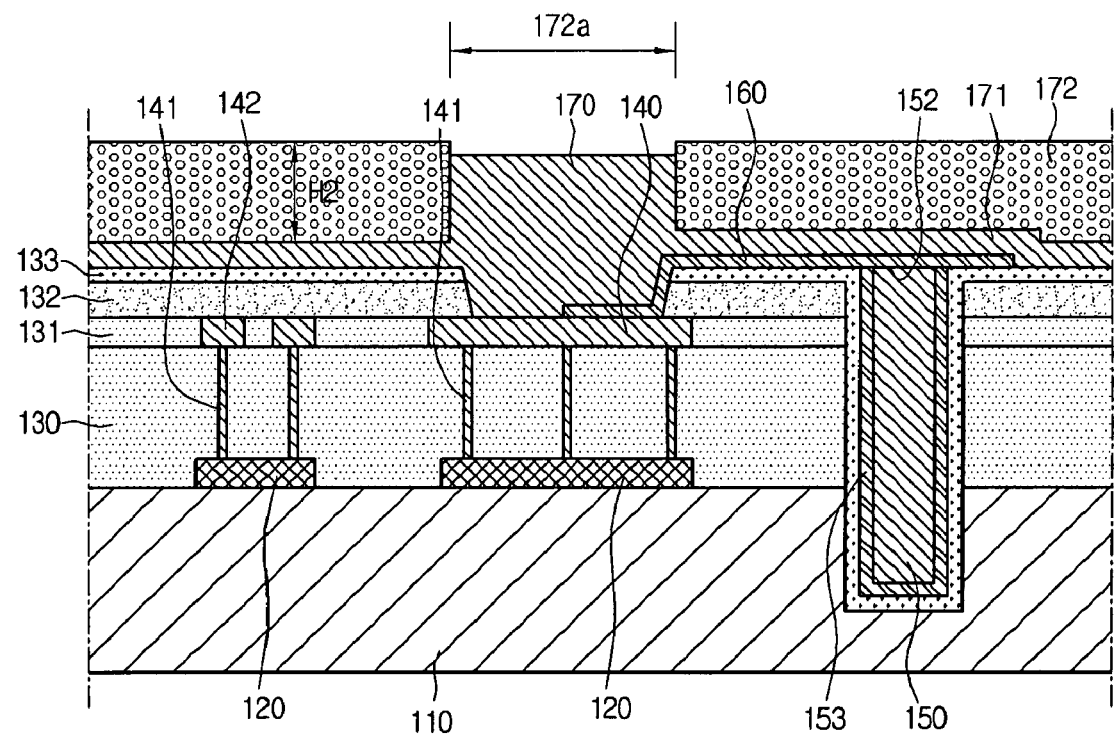

Referring to FIG. 2K, a photoresist pattern 172 having a hole 172a corresponding to the top metal 140 may be formed on the second metal layer 171, and the same metal as that used for forming the top metal 140 may be deposited in the hole 172a by an electroplating method so as to form a bump 170. The bump 170 may be formed by using the second metal layer 171 as a seed layer.

The height H2 of the photoresist pattern 172 may be about 5 μm to about 50 μm, and the height of the bump 170 may be about 3 μm to about 50 μm.

Figure 2L:
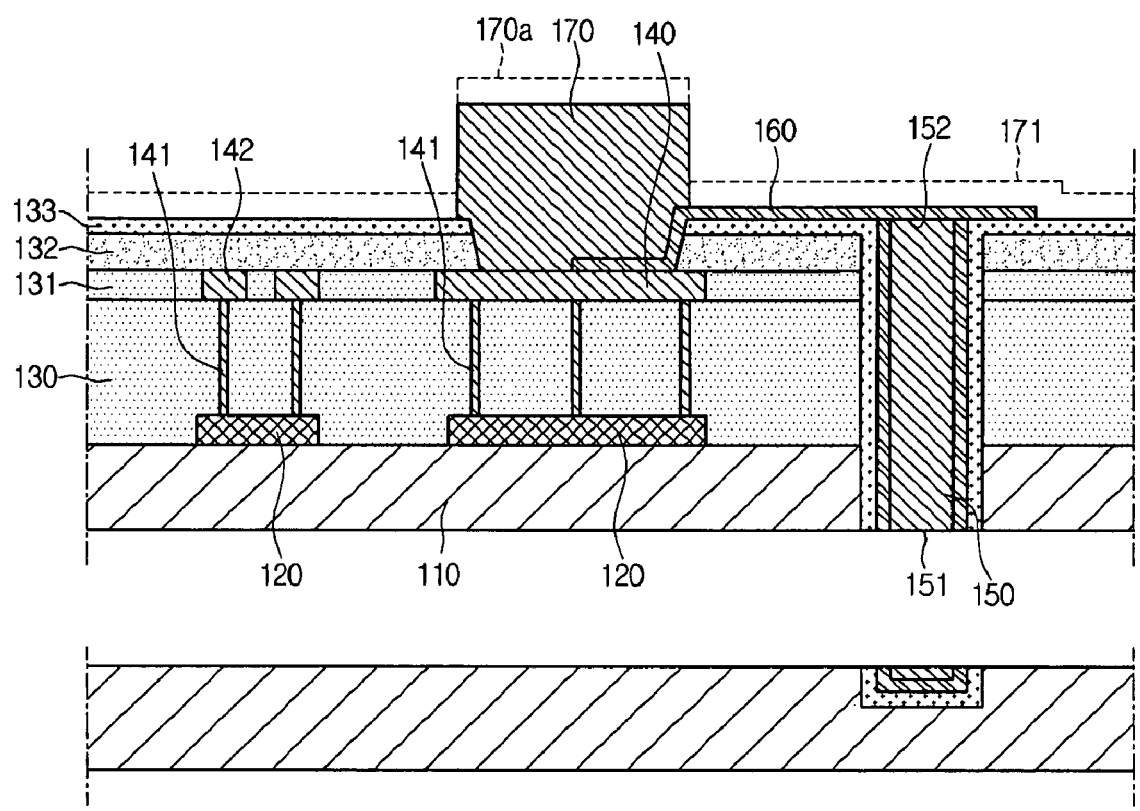

Referring to FIG. 2L, the photoresist pattern 172 may be removed, and a portion 170a of the bump 170 and the second metal layer 171 may be removed through an isotropic etching process. A substance comprising, for example, nitric acid, may be used as an etchant for the isotropic etching process.

Thereafter, a lower portion of the semiconductor substrate 110 may be removed through a process such as a CMP process so as to expose a lower end surface 151 of the deep via 150. At this time, the thickness of the remaining semiconductor substrate 110 may be about 40 μm to about 60 μm.

Figure 3:
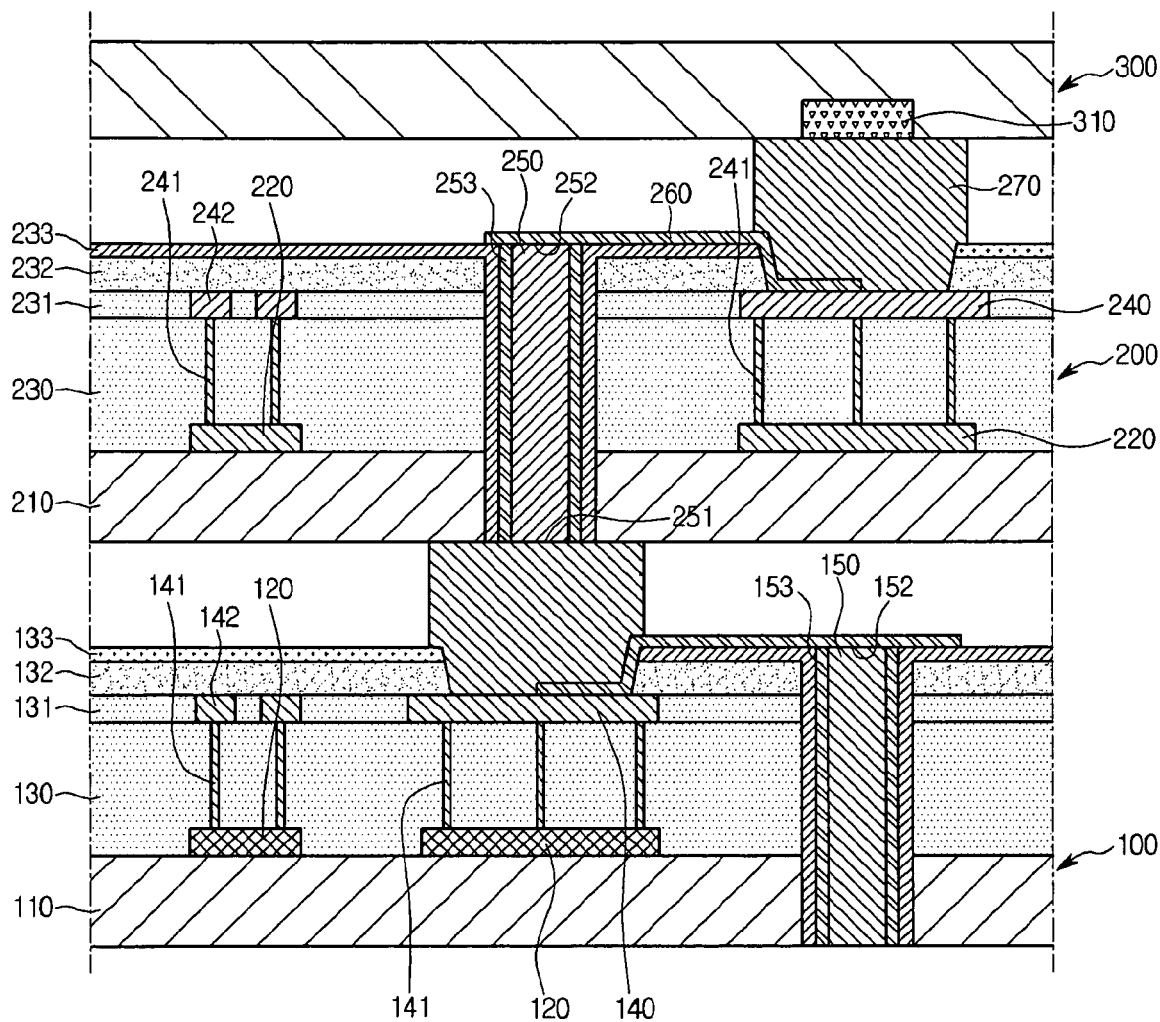
FIG. 3 is a cross-sectional view illustrating an exemplary semiconductor chip stack package according to embodiments of the present invention.

FIG. 3 is a cross-sectional view illustrating an exemplary semiconductor chip stack package according to embodiments of the present invention. In FIG. 3, a first semiconductor chip 100 and a second semiconductor chip 200 will be explained with reference to the above-described semiconductor chip.

Referring to FIG. 3, the semiconductor chip stack package may include the first semiconductor chip 100, the second semiconductor chip 200, and a circuit substrate 300.

The first semiconductor chip 100 may include a first semiconductor substrate 110, a first semiconductor device 120, a first interlayer dielectric 130, a first top metal 140, a first deep via 150, a first interconnection 160, and a first bump 170.

The first semiconductor device 120 may be on the first semiconductor substrate 110, and the first interlayer dielectric 130 may cover the first semiconductor device 120.

The first deep via 150 may penetrate the first semiconductor substrate 110 and the first interlayer dielectric 130 and may be electrically connected to the first top metal 140 through the first interconnection 160.

The first bump 170 may be in contact with the first top metal 140. The first bump 170 may protrude from the top surface of the first semiconductor chip 100. The first bump 170, the first top metal 140, and the first deep via 150 may comprise the same metal.

The second semiconductor chip 200 may be on the first semiconductor chip 100. The second semiconductor chip 200 may include a second semiconductor substrate 210, a second semiconductor device 220, a second interlayer dielectric 230, a second top metal 240, a second deep via 250, a second interconnection 260, and a second bump 270.

The second semiconductor device 220 may be on the second semiconductor substrate 210 and may be electrically connected to the second top metal 240. The second top metal 240 may be connected to the second deep via 250 through the second interconnection 260.

The second deep via 250 may penetrate the second interlayer dielectric 230 and the second semiconductor substrate 210. A lower end surface 251 of the second deep via 250 may be in contact with the first bump 170 and may be electrically connected to the bump 170.

The second bump 270 may be in contact with the second top metal 240 and may be on the second top metal 240.

The second bump 270, the second top metal 240, and the second deep via 250 may comprise the same metal. In addition, the second bump 270, the second top metal 240, and the second deep via 250 may comprise the same metal as that used for forming the first bump 170, the first top metal 140, and the first deep via 150.

The circuit substrate 300 may be on the second semiconductor chip 200. The circuit substrate 300 may be exposed to the outside and may include a conductive pad 310. The pad 310 may be in contact with the second bump 270 and may be electrically connected to the second bump 270.

The first bump 170, the first top metal 140, the first deep via 150, the second bump 270, the second top metal 240, and the second deep via 250 may comprise the same metal.

Therefore, the resistance between the first bump 170 and the second deep via 250, the resistance between the first bump 170 and the first top metal 140, and the resistance between the second bump 270 and the second top metal 240 may be low. Accordingly, a semiconductor chip stack package according to embodiments of the present invention can have improved performance.

Furthermore, the bonding strength between the first bump 170 and the second deep via 250, and the bonding strength between the first bump 170 and the first top metal 140 can be high. Therefore, a semiconductor chip stack package according to embodiments of the present invention can be highly durable.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other embodiments.

Although embodiments of the present invention have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor chip comprising:
    a semiconductor substrate;

a semiconductor device on the semiconductor substrate;
a dielectric covering the semiconductor device;
a top metal on the dielectric and electrically connected to the semiconductor device;
a deep via passing through the semiconductor substrate and the dielectric;
an interconnection electrically connecting the deep via and the top metal, wherein the interconnection directly contacts a first part of an upper surface of the top metal; and
a bump in contact with the top metal and the interconnection, wherein the bump directly contacts a second part of the upper surface of the top metal and an upper surface of the interconnection.

2. The semiconductor chip according to claim 1, wherein the interconnection covers a top surface of the deep via and a portion of the top metal.

3. The semiconductor chip according to claim 1, wherein the top metal, the bump, and the deep via comprise the same metal.

4. The semiconductor chip according to claim 3, wherein the top metal, the bump, and the deep via comprise at least one of copper or tungsten.

5. The semiconductor chip according to claim 1, wherein the interconnection comprises at least one of tantalum, titanium, tungsten, tantalum nitride, titanium nitride, tungsten nitride, or titanium silicon nitride.

6. A semiconductor chip stack package comprising:
a first semiconductor chip comprising a first semiconductor device on a first semiconductor substrate, a first top metal electrically connected to the first semiconductor device, and a first bump in contact with the first top metal; and
a second semiconductor chip on the first semiconductor chip and comprising a second semiconductor device on a second semiconductor substrate, a deep via passing through the second semiconductor substrate in contact with the first bump, a second top metal connected to the second semiconductor device, a second bump in contact with the second top metal, and an interconnection connecting the deep via and the second top metal, wherein (a) the interconnection directly contacts a first part of an upper surface of the second top metal, and (b) the second bump directly contacts a second part of the upper surface of the second top metal and an upper surface of the interconnection.

7. The semiconductor chip stack package according to claim 6, further comprising a circuit substrate on the second semiconductor chip and in contact with the second bump.

8. The semiconductor chip stack package according to claim 6, wherein the first top metal, the deep via, and the first bump comprise the same metal.

9. The semiconductor chip according to claim 1, further comprising a passivation layer and a buffer layer in a pattern on the top metal, the insulating layer, and the interconnection such that at least a portion of the top metal is exposed.

10. The semiconductor chip according to claim 9, wherein the deep via passes through the semiconductor substrate, the dielectric, the passivation layer, and the buffer layer.

11. The semiconductor chip according to claim 1, wherein the deep via is surrounded by a barrier metal layer and a buffer layer.

12. The semiconductor chip according to claim 11, wherein the barrier metal layer comprises tantalum, tantalum nitride, tantalum silicon nitride, titanium silicon nitride, or rubidium, and the buffer layer comprises silicon oxide, silicon nitride, or silicon oxynitride.

13. The semiconductor chip according to claim 1, wherein the deep via has a width of from about 1 μm to about 100 μm and a length of from about 1 μm to about 300 μm.

14. The semiconductor chip according to claim 1, wherein the bump protrudes from a top surface of the semiconductor chip.

15. The semiconductor chip stack package according to claim 6, wherein the first bump and the deep via of the second semiconductor chip comprise the same metal.

16. The semiconductor chip stack package according to claim 6, wherein the second top metal, the second bump, and the deep via comprise the same metal.

17. The semiconductor chip stack package according to claim 6, wherein the first top metal, the second top metal, the first bump, the second bump, and the deep via comprise the same metal.

18. The semiconductor chip stack package according to claim 6, further comprising a circuit on the second semiconductor chip, wherein the circuit comprises a conductive pad electrically connected to the second bump.

19. The semiconductor chip stack package according to claim 6, further comprising a barrier metal layer and a buffer layer surrounding the deep via.

20. The semiconductor chip stack package according to claim 19, wherein the barrier metal layer comprises tantalum, tantalum nitride, tantalum silicon nitride, titanium silicon nitride, or rubidium, and the buffer layer comprises silicon oxide, silicon nitride, or silicon oxynitride.

* * * * *